United States Patent [19]

Okuma et al.

[11] 4,224,174
[45] Sep. 23, 1980

[54] PIEZOELECTRIC OXIDE MATERIALS

[75] Inventors: Hideo Okuma, Kawasaki; Takashi Takahashi, Tokyo; Yohachi Yamashita; Osamu Furukawa, both of Kawasaki, all of Japan

[73] Assignee: Tokyo Shibaura Denki Kabushiki Kaisha, Kawasaki, Japan

[21] Appl. No.: 974,545

[22] Filed: Dec. 29, 1978

[30] Foreign Application Priority Data

Dec. 29, 1977 [JP] Japan .................. 53-158930

[51] Int. Cl.$^2$ .............................................. C04B 35/46
[52] U.S. Cl. .................................................. 252/62.9
[58] Field of Search ........................................ 252/62.9

[56] References Cited

U.S. PATENT DOCUMENTS

| 3,068,177 | 12/1962 | Sugden | 252/62.9 |
| 3,463,732 | 8/1969 | Banno et al. | 252/62.9 |

FOREIGN PATENT DOCUMENTS

| 49-20158 | 5/1974 | Japan | 252/62.9 |
| 49-20159 | 5/1974 | Japan | 252/62.9 |
| 49-29398 | 8/1974 | Japan | 252/62.9 |

OTHER PUBLICATIONS

Ouchi "J. of the American Ceramic Soc.", vol. 51, No. 3, Mar. 1968, pp. 169–176.

Primary Examiner—Jack Cooper
Attorney, Agent, or Firm—Oblon, Fisher, Spivak, McClelland & Maier

[57] ABSTRACT

A piezoelectric oxide material having a general formula $$(1-x)PbTiO_3 - xPb(CO_{\frac{1}{2}}W_{\frac{1}{2}})O_3$$

where, "x" ranges between 0.01 and 0.20, and 0.5 to 20 atomic % of Pb is replaced by at least one element selected from the group of Ba, Sr and Ca.

The piezoelectric oxide material of this composition has a high Curie point, is suitable for use in high frequency regions and can be readily polarized.

4 Claims, 5 Drawing Figures

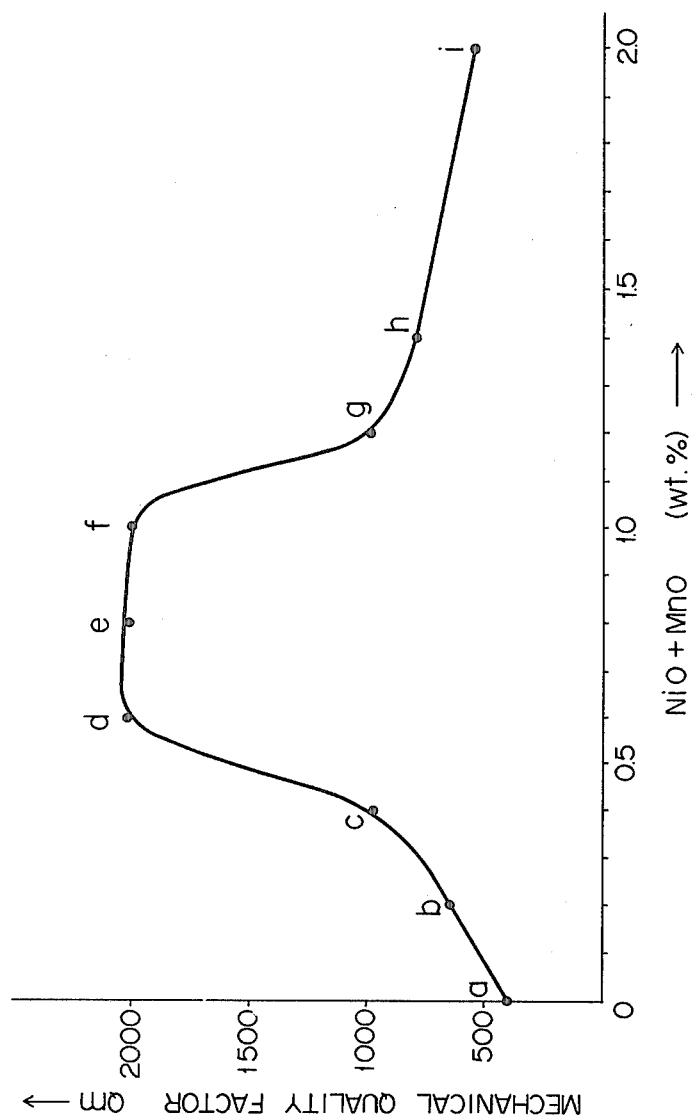

PIEZOELECTRIC OXIDE MATERIALS

BACKGROUND OF THE INVENTION

This invention relates to piezoelectric oxide materials, particularly, to those having a binary metal oxide system of $PbTiO_3$-$Pb(Co_{\frac{1}{3}}W_{\frac{1}{2}})O_3$ in which Pb is partly replaced by at least one element selected from the group consisting of Ba, Sr and Ca.

As is well known, piezoelectric materials are used in wide fields including ultrasonic vibration elements, transducer elements of, for example, mechanical filters, elements of ceramic filters and ceramic vibrators, and elements of vibrometers and accelerometers. Various efforts are being made to provide improved piezoelectric materials based on a binary metal oxide system of $PbTiO_3$-$PbZrO_3$ for use in such fields. For example, it has been proposed to mix additives such as $Bi_2O_3$, $Cr_2O_3$, $MnO_2$ and ZnO into a binary system of $PbTiO_3$-$PbZrO_3$ in order to provide materials having an improved piezoelectric property. Further, piezoelectric materials based on a ternary system of $PbTiO_3$-$PbZrO_3$-$(Mg_{\frac{1}{3}}Nb_{\frac{2}{3}})O_3$ are also under development. However, these piezoelectric materials have a curie point of about 300° C. and, thus, can not be used under temperatures higher than 300° C. Also, these piezoelectric materials have a dielectric constant as large as about 1,000 and, thus, are unsuitable for use in a high frequency region.

Also reported are $PbTiO_3$ type piezoelectric materials having a dielectric constant as small as 150 to 250. However, these materials tend to bear cracks after subjected to a sintering treatment, rendering it impossible to prepare a large sintered mass having a diameter of 20 mm or more. Naturally, the $PbTiO_3$ type material is unsuitable for use as a piezoelectric material generating a strong ultrasonic wave and for forming transducing elements of probes for linear scan type ultrasonic diagnosis apparatus. An additional difficulty inherent in the $PbTiO_3$ type material is a severe polarizing condition. Specifically, it is necessary to apply an electric field of as high as 60 KV/cm at 200° C. in order to polarize the $PbTiO_3$ type piezoelectric material, leading to a low yield of the product. Further, the conventional $PbTiO_3$ type material has a mechanical quality factor Qm of about 1,000 at most.

SUMMARY OF THE INVENTION

An object of this invention is to provide $PbTiO_3$ type piezoelectric oxide materials having a high Curie point, a low dielectric constant and is easy to be polarized. The piezoelectric material of this invention can be used stably under temperatures higher than 300° C. and in frequency region higher than several MHz. In addition, the polarizing condition of the material of this invention is prominently mild, compared with the conventional $PbTiO_3$ type piezoelectric material.

According to this invention, there is provided a piezoelectric oxide material of a binary metal oxide system having a general formula;

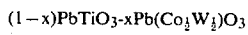

where, "x" ranges between 0.01 and 0.20, preferably, between 0.01 and 0.10, more preferably, between 0.01 and 0.05, and 0.5 to 20 atomic %, preferably, 0.5 to 10 atomic % of Pb is replaced by at least one element selected from the group consisting of Ba, Sr and Ca.

BRIEF DESCRIPTION OF THE DRAWINGS

FIG. 5 shows the relationship between the mechanical quality factor Qm and the amount of additives consisting of MnO and NiO.

PREFERRED EMBODIMENT OF THE INVENTION

Figure 1:
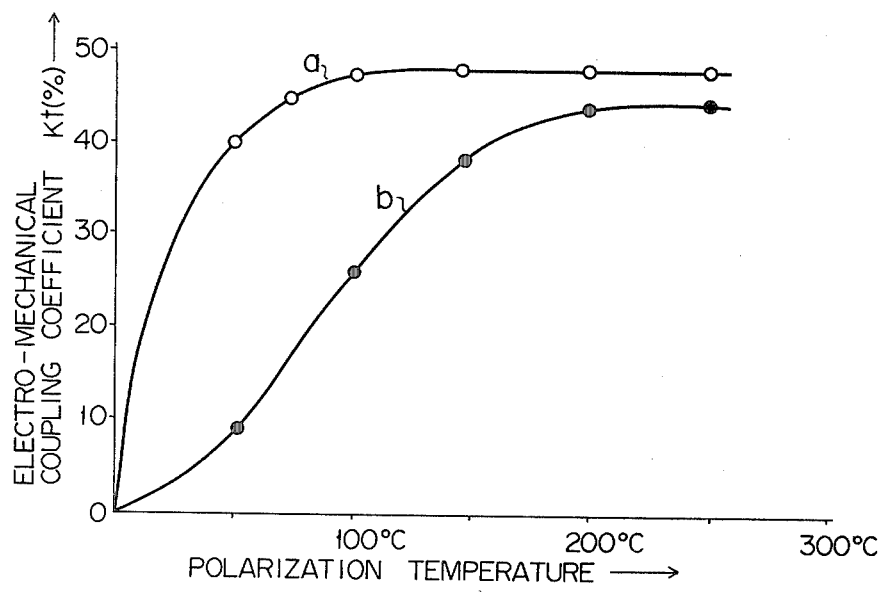
FIG. 1 is a graph showing the relationship between the polarization temperature and the electro-mechanical coupling coefficient for a piezoelectric material according to this invention and a conventional piezoelectric material.

The piezoelectric oxide material of this invention has a general formula

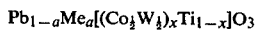

where, "Me" is at least one metal element selected from the group consisting of Ba, Sr and Ca, "x" ranges between 0.01 and 0.20, preferably, between 0.01 and 0.10, more preferably between 0.01 and 0.05, and "a" ranges between 0.005 and 0.20, preferably, between 0.005 and 0.10.

It is possibly to enable the piezoelectric oxide material of the above general formula to exhibit more improved temperature characteristic, time variability and mechanical quality factor by adding at least one additive selected from the group consisting of MnO, NiO and $Fe_2O_3$ in an amount of 0.05 to 2.0 wt%, preferably, 0.05 to 1.0 wt%, more preferably, 0.05 to 0.5 wt%.

The piezoelectric material of this invention can be prepared without difficulty by employing a conventional powder metallurgical process. For example, predetermined amounts of raw metal oxides including PbO, $TiO_2$, CoO, $WO_3$ and MeO ("Me" representing Ba, Sr or Ca) are sufficiently mixed first at a predetermined ratio by using, for example, a ball mill. Incidentally, metal compounds capable of conversion to metal oxides upon heating such as hydroxides, carbonates and oxalates of metals can also be used as the raw materials in place of the metal oxides.

The metal oxide mixture is presintered at, for example, about 600° C. to 900° C., followed by grinding the presintered mass by using, for example, a ball mill so as to obtain a powder of a desired particle size, for example, a powder having a particle size of about 1 to 2$\mu$. A binder such as water or polyvinyl alcohol is added to the powder and then, the mixture is shaped by pressure molding under a pressure of about 0.5 to 2 tons/cm$^2$, followed by sintering the shaped mass at about 1,000° C. to 1,250° C. It is important to carry out the sintering treatment within a closed furnace because PbO tends to escape partly by evaporation. In general, it suffices to maintain the highest temperature in the sintering step for about.

The sintered mass of metal oxides thus obtained is polarized by a known method. For example, a pair of electrodes are baked to both sides of the sintered mass and a D.C. voltage of an electric field intensity of 40 to 60 KV/cm is applied across the electrodes for 1 to 30 minutes within a silicone oil maintained at 80° to 150° C. so as to polarize the sintered mass.

As described previously, the piezoelectric oxide material of this invention is represented by a general formula $$(1-x)PbTiO_3-xPb(Co_{\frac{1}{2}}W_{\frac{1}{2}})O_3$$

where, "x" ranges between 0.01 and 0.20.

If the value of "x" is greater than 0.20, the piezoelectric material has a Curie point of at most 350° C. and, thus, can not be used stably at temperatures higher than 300° C. Further, the value of "x" greater than 0.20 causes the piezoelectric material to have a dielectric constant of at least 250, resulting in difficulty to use the piezoelectric material in a high frequency region. It is important to note that the value of "x" ranging, particularly, between 0.01 and 0.10 enables the piezoelectric material to exhibit a Curie point higher than 400° C., rendering the piezoelectric material particularly suitable for use at high temperatures.

In this invention, 0.5 to 20 atomic % of Pb is replaced by at least one element selected from Ba, Sr and Ca so as to facilitate the sintering and polarizing treatments referred to previously. The amount of replacement smaller than 0.5 atomic % fails to produce the particular effect mentioned. On the other hand, the value greater than 20 atomic % causes the piezoelectric material to have a Curie point not higher than 350° C., resulting in difficulty to use the piezoelectric material at temperatures higher than 300° C. It is important to note that the piezoelectric material is enabled to exhibit a Curie point higher than 450° C. particularly where the value of "x" ranges between 0.05 and 0.10 and the amount of Pb replacement ranges between 0.5 and 10 atomic %. Naturally, such a material is particularly suitable for use at high temperatures.

Further, at least one additive selected from MnO, NiO and $Fe_2O_3$ is used in this invention in an amount of 0.05 to 2.0 wt % so as to improve the temperature characteristic, time variability and mechanical quality factor of the piezoelectric material. If the amount of the additive is smaller than 0.05 wt %, the particular effects mentioned can not be produced. On the other hand, the value greater than 2.0 wt % leads to an unsatisfactory sintering property of the metal oxide mixture. If the amount of the additive ranges between 0.05 and 2.0 wt %, the piezoelectric material is enabled to exhibit a mechanical quality factor of 500 to 2,000 and thus, is rendered suitable for forming various vibration elements. Where the value ranges, particularly, between 0.5 and 1.0 wt %, the material is enabled to exhibit a Curie point higher than 450° C. and a mechanical quality factor exceeding 1,000. In this case, the piezoelectric material is suitable for use as the material of vibration elements exposed to high temperatures.

It is convenient to summarize in the following the advantages of this invention over the prior art.

(1) $PbTiO_3$ has a Curie point as high as about 500° C. But, this material is unsatisfactory in sintering property, rendering it difficult to put the material to practical uses. In the present invention, however, $Pb(Co_{\frac{1}{2}}W_{\frac{1}{2}})O_3$ is used as one component of the binary system and Pb is partly replaced by Ba, Sr and Ca. What should be noted is that Co, W, Ba, Sr and Ca act as a mineralizer, thereby facilitating the sintering treatment of the metal oxide mixture. Naturally, the mixture has a low sintering temperature and, thus, the PbO contained in the mixture is prevented from evaporation in the sintering step, thereby permitting producing a dense piezoelectric material without difficulty.

It is also important to note that the conventional $PbTiO_3$ type ceramic must be sintered in a manner to suppress the growth of grains to, for example, 3μ or less in order to prevent the sintered mass from bearing cracks. In the present invention, however, Ba, Sr or Ca partly replacing Pb serves to suppress the grain growth, leading to an improved sintering property of the metal oxide mixture.

(2) The component of Ba, Sr or Ca partly replacing Pb also serves to facilitate the polarization of the $PbTiO_3$ type ceramic. Specifically, it is necessary to apply a D.C. electric field of 60 to 80 KV/cm at such a high temperature as 180° to 200° C. for polarizing the conventional $PbTiO_3$ type ceramic. In contrast, the piezoelectric oxide material of the present invention can be polarized sufficiently by applying a D.C. electric field of 40 to 60 KV/cm at 80° to 150° C.

(3) The use of at least one additive selected from the group of MnO, NiO and $Fe_2O_3$ renders the piezoelectric oxide material of the present invention prominently advantageous over the conventional $PbTiO_3$ type ceramic in temperature characteristic, time variability and mechanical quality factor. For example, the particular additive permits readily preparing a sintered mass of excellent time variability in various forms including a disc having 50 mm of diameter and 1 mm of thickness and a rectangular plate sized 100 mm×20 mm×1 mm. Described in the following are Examples of this invention.

EXAMPLES

Raw materials of PbO, $TiO_2$, CoO, $WO_3$ and MeO ("Me" representing at least one of Ba, Sr and Ca) were sufficiently mixed at various mixing ratios by a ball mill. Then, each of the mixtures was presintered at 800° C., followed by grinding the presintered mass by a ball mill into a powder having a particle size of 1 to 2μ. The powder sample thus obtained was mixed with polyvinyl alcohol and shaped under a pressure of 1 ton/cm², followed by sintering the shaped mass at 1080° C. to 1200° C. The resultant sintered mass was abraded into a disc 20 mm in diameter and 1.0 mm in thickness and a pair of silver electrodes were baked to both sides of the disc. Then, a voltage generating 60 KV/cm of D. C. field intensity was applied across the electrodes within a silicone oil maintained at 100° C. so as to polarize the disc.

Piezoelectric properties of the polarized disc were measured by a standard process described in, for example, "The proceedings of I.R.E., Vol. 137, pp 1378 to 1395, 1949", the results being shown in Table 1. The symbols used in Table 1 represent:

F.T.—Sintering temperature (°C.)
D—Specific gravity at 23° C.,
$\epsilon$—Dielectric constant measured at 1 KHz and 23° C.,
Kt—Electro-mechanical coupling coefficient (%),
Qm—Mechanical quality factor, and
Tc—Curie point.

Table 1

Composition $$Pb_{1-a}Me_a[(Co_{\frac{1}{2}}W_{\frac{1}{2}})_xTi_{1-x}]O_3 + b\begin{pmatrix}MnO\\NiO\\Fe_2O_3\end{pmatrix}$$

| | | $a(\times 10^{-2})$ | $x(\times 10^{-2})$ | $1-x(\times 10^{-2})$ | b(wt.%) | F.T (°C.) | D (g/cm³) | $\epsilon$ | Kt (%) | $T_c$ (°C.) | $Q_m$ |
|---|---|---|---|---|---|---|---|---|---|---|---|
| Example 1 | Me = Ba 0.5 | | 1.0 | 99.0 | — | 1200 | 7.68 | 163 | 43.7 | 510 | 402 |
| Example 2 | Me = Sr 0.5 | | 1.0 | 99.0 | — | 1200 | 7.66 | 161 | 44.2 | 507 | 396 |
| Example 3 | Me = Ca 0.5 | | 1.0 | 99.0 | — | 1200 | 7.63 | 159 | 43.9 | 502 | 389 |
| Example 4 | Me = Ba 5.0 | | 1.0 | 99.0 | — | 1200 | 7.69 | 169 | 44.9 | 493 | 354 |
| Example 5 | Me = Sr 5.0 | | 1.0 | 99.0 | — | 1200 | 7.67 | 167 | 44.9 | 490 | 372 |
| Example 6 | Me = Ba 10.0 | | 1.0 | 99.0 | — | 1200 | 7.60 | 173 | 45.8 | 483 | 302 |
| Example 7 | Me = Sr 10.0 | | 1.0 | 99.0 | — | 1200 | 7.59 | 170 | 46.2 | 481 | 333 |
| Example 8 | Me = Sr 20.0 | | 1.0 | 99.0 | — | 1200 | 7.54 | 199 | 45.3 | 462 | 299 |
| Control 1 | — | | 1.0 | 99.0 | — | 1200 | 7.17 | 157 | 27.2 | 514 | 344 |
| Control 2 | Me = Sr 0.3 | | 1.0 | 99.0 | — | 1200 | 7.40 | 150 | 32.1 | 512 | 349 |
| Example 9 | Me = Ca 20.0 | | 1.0 | 99.0 | — | 1200 | 7.52 | 196 | 45.5 | 443 | 283 |
| Example 10 | Me = Ba 0.3 Me = Sr 0.2 | | 1.0 | 99.0 | — | 1200 | 7.67 | 161 | 45.9 | 500 | 377 |
| Example 11 | Me = Sr 3.0 Me = Ca 2.0 | | 1.0 | 99.0 | — | 1200 | 7.68 | 174 | 45.4 | 483 | 355 |
| Example 12 | Me = Ba 5.0 Me = Ca 5.0 | | 1.0 | 99.0 | — | 1200 | 7.60 | 179 | 46.2 | 477 | 353 |
| Example 13 | Me = Sr 10.0 Me = Ca 10.0 | | 1.0 | 99.0 | — | 1200 | 7.54 | 196 | 45.7 | 449 | 311 |
| Example 14 | Me = Ba 0.2 Me = Sr 0.2 Me = Ca 0.1 | | 1.0 | 99.0 | — | 1200 | 7.67 | 162 | 44.8 | 498 | 334 |
| Example 15 | Me = Ba 2.0 Me = Sr 2.0 Me = Ca 1.0 | | 1.0 | 99.0 | — | 1200 | 7.66 | 169 | 45.5 | 480 | 376 |
| Control 3 | Me = Sr 25.0 | | 1.0 | 99.0 | — | 1200 | 7.49 | 252 | 43.7 | 399 | 277 |
| Control 4 | Me = Ba 15.0 Me = Sr 15.0 | | 1.0 | 99.0 | — | 1200 | 7.40 | 294 | 40.0 | 360 | 295 |
| Example 17 | Me = Ba 0.5 Me = Sr 0.3 | | 5.0 | 95.0 | — | 1140 | 7.79 | 174 | 46.2 | 490 | 292 |
| Example 18 | Me = Ca 0.2 | | 5.0 | 95.0 | — | 1140 | 7.80 | 176 | 46.4 | 482 | 283 |
| Example 19 | Me = Ca 5.0 | | 5.0 | 95.0 | — | 1140 | 7.73 | 193 | 47.0 | 477 | 302 |
| Example 20 | Me = Ba 2.5 Me = Sr 2.5 | | 5.0 | 95.0 | — | 1140 | 7.74 | 190 | 47.3 | 479 | 345 |
| Example 21 | Me = Sr 10.0 | | 5.0 | 95.0 | — | 1140 | 7.66 | 202 | 48.4 | 452 | 314 |
| Example 22 | Me = Ba 5.0 Me = Sr 5.0 | | 5.0 | 95.0 | — | 1140 | 7.66 | 211 | 48.0 | 423 | 297 |
| Example 23 | Me = Ca 5.0 Me = Ba 20.0 | | 5.0 | 95.0 | — | 1140 | 7.61 | 220 | 47.3 | 411 | 365 |
| Example 24 | Me = Ba 10.0 Me = Ca 10.0 | | 5.0 | 95.0 | — | 1140 | 7.60 | 217 | 47.0 | 403 | 372 |
| Control 5 | Me = Sr 0.3 | | 5.0 | 95.0 | — | 1140 | 7.47 | 166 | 40.0 | 493 | 392 |
| Control 6 | Me = Ca 25.0 | | 5.0 | 95.0 | — | 1140 | 7.41 | 254 | 30.4 | 372 | 300 |
| Example 25 | Me = Ba 0.5 Me = Sr 0.3 | | 10.0 | 90.0 | — | 1120 | 7.82 | 201 | 44.2 | 449 | 420 |
| Example 26 | Me = Ca 0.2 | | 10.0 | 90.0 | — | 1120 | 7.81 | 203 | 44.4 | 447 | 377 |
| Example 27 | Me = Ca 0.5 | | 10.0 | 90.0 | — | 1120 | 7.80 | 197 | 45.0 | 444 | 353 |
| Example 28 | Me = Ba 2.5 Me = Sr 2.5 | | 10.0 | 90.0 | — | 1120 | 7.76 | 211 | 47.3 | 432 | 333 |
| Example 29 | Me = Sr 10.0 | | 10.0 | 90.0 | — | 1120 | 7.74 | 225 | 47.6 | 421 | 353 |
| Example 30 | Me = Ba 5.0 Me = Sr 5.0 | | 10.0 | 90.0 | — | 1120 | 7.71 | 236 | 47.1 | 411 | 383 |
| Example 31 | Me = Ca 5.0 Me = Ba 20.0 | | 10.0 | 90.0 | — | 1120 | 7.67 | 272 | 46.0 | 400 | 327 |
| Example 32 | Me = Ba 10.0 Me = Ca 10.0 | | 10.0 | 90.0 | — | 1120 | 7.66 | 254 | 45.7 | 400 | 299 |
| Control 7 | Me = Ba 0.3 | | 10.0 | 90.0 | — | 1120 | 7.50 | 191 | 39.9 | 472 | 349 |
| Control 8 | Me = Sr 25.0 | | 10.0 | 90.0 | — | 1120 | 7.49 | 305 | 42.3 | 372 | 348 |
| Example 33 | Me = Ba 0.5 Me = Sr 0.3 | | 20.0 | 80.0 | — | 1080 | 7.86 | 215 | 41.1 | 391 | 416 |
| Example 34 | Me = Ca 0.2 | | 20.0 | 80.0 | — | 1080 | 7.84 | 210 | 41.4 | 390 | 422 |
| Example 35 | Me = Ca 5.0 | | 20.0 | 80.0 | — | 1080 | 7.79 | 233 | 40.9 | 395 | 414 |

Table 1-continued

Composition $$Pb_{1-a}Me_a[(Co_{\frac{1}{2}}W_{\frac{1}{2}})_xTi_{1-x}]O_3 + b\begin{pmatrix} MnO \\ NiO \\ Fe_2O_3 \end{pmatrix}$$

| | | $a(\times 10^{-2})$ | $x(\times 10^{-2})$ | $1-x(\times 10^{-2})$ | b(wt.%) | F.T (°C.) | D (g/cm³) | ε | Kt (%) | $T_c$ (°C.) | $Q_m$ |
|---|---|---|---|---|---|---|---|---|---|---|---|
| Example 36 | Me = Ba 2.5 | | 20.0 | 80.0 | — | 1080 | 7.81 | 229 | 41.8 | 390 | 395 |
| Example 37 | Me = Sr 2.5 Me = Sr 10.0 | | 20.0 | 80.0 | — | 1080 | 7.74 | 254 | 41.7 | 385 | 437 |
| Example 38 | Me = Ba 5.0 Me = Sr 5.0 | | 20.0 | 80.0 | — | 1080 | 7.70 | 272 | 41.0 | 363 | 445 |
| Example 39 | Me = Ca 5.0 Me = Ba 20.0 | | 20.0 | 80.0 | — | 1100 | 7.69 | 299 | 40.3 | 357 | 383 |
| Example 40 | Me = Ba 10.0 Me = Ca 10.0 | | 20.0 | 80.0 | — | 1100 | 7.71 | 287 | 40.4 | 352 | 393 |
| Control 9 | Me = Ca 0.3 | | 20.0 | 80.0 | — | 1080 | 7.61 | 210 | 37.7 | 396 | 407 |
| Control 10 | Me = Ba 25.0 | | 20.0 | 80.0 | — | 1080 | 7.49 | 344 | 39.3 | 301 | 445 |
| Example 41 | Me = Sr 10.0 | | 5.0 | 95.0 | MnO 0.05 | 1150 | 7.71 | 200 | 45.2 | 455 | 975 |
| Example 42 | Me = Sr 10.0 | | 5.0 | 95.0 | MnO 0.5 | 1150 | 7.76 | 196 | 45.9 | 453 | 1314 |
| Example 43 | Me = Sr 10.0 | | 5.0 | 95.0 | Fe₂O₃ 1.0 | 1150 | 7.75 | 206 | 45.8 | 451 | 1640 |
| Example 44 | Me = Sr 10.0 | | 5.0 | 95.0 | MnO 2.0 | 1150 | 7.74 | 210 | 45.0 | 456 | 990 |
| Example 45 | Me = Sr 10.0 | | 5.0 | 95.0 | NiO 0.5 | 1150 | 7.78 | 214 | 46.9 | 459 | 1015 |
| Example 46 | Me = Sr 10.0 | | 5.0 | 95.0 | NiO 2.0 | 1150 | 7.72 | 233 | 46.3 | 453 | 808 |
| Example 47 | Me = Sr 10.0 | | 5.0 | 95.0 | NiO 0.25 MnO 0.25 | 1150 | 7.80 | 220 | 48.2 | 457 | 1631 |
| Example 48 | Me = Sr 10.0 | | 5.0 | 95.0 | Fe₂O₃ 1.0 NiO 1.0 | 1150 | 7.76 | 227 | 47.3 | 452 | 900 |
| Control 11 | Me = Sr 10.0 | | 5.0 | 95.0 | MnO 0.02 | 1150 | 7.55 | 199 | 41.0 | 455 | 490 |
| Control 12 | Me = Sr 10.0 | | 5.0 | 95.0 | MnO 1.5 NiO 1.5 | 1150 | 7.02 | no polarization | — | — | — |
| Example 49 | Me = Sr 5.0 | | 5.0 | 95.0 | — | 1150 | 7.75 | 192 | 46.2 | 477 | 401 |
| Example 50 | Me = Sr 5.0 | | 5.0 | 95.0 | NiO 0.1 | 1150 | 7.79 | 199 | 46.5 | 470 | 650 |
| Example 51 | Me = Sr 5.0 | | 5.0 | 95.0 | MnO 0.1 NiO 0.2 | 1150 | 7.82 | 200 | 46.6 | 463 | 980 |
| Example 52 | Me = Sr 5.0 | | 5.0 | 95.0 | MnO 0.2 NiO 0.3 | 1150 | 7.88 | 205 | 46.0 | 461 | 2010 |
| Example 53 | Me = Sr 5.0 | | 5.0 | 95.0 | MnO 0.3 NiO 0.4 | 1150 | 7.90 | 211 | 45.9 | 461 | 2008 |
| Example 54 | Me = Sr 5.0 | | 5.0 | 95.0 | MnO 0.4 NiO 0.5 | 1150 | 7.84 | 210 | 45.9 | 459 | 2000 |
| Example 55 | Me = Sr 5.0 | | 5.0 | 95.0 | MnO 0.5 NiO 0.6 | 1150 | 7.83 | 214 | 45.6 | 455 | 996 |
| Example 56 | Me = Sr 5.0 | | 5.0 | 95.0 | MnO 0.6 NiO 0.7 | 1150 | 7.80 | 210 | 45.1 | 456 | 200 |
| Example 57 | Me = Sr 5.0 | | 5.0 | 95.0 | MnO 0.7 NiO 1.0 MnO 1.0 | 1150 | 7.77 | 218 | 45.0 | 455 | 550 |

FIG. 1 shows the relationship between the electromechanical coupling coefficient Kt and the polarization temperature obtained from measurments applied to the materials of Example 21 and Control 1 shown in Table 1. Curves (a) and (b) shown in FIG. 1 represent Example 21 and Control 1, respectively. It is clearly seen that the piezoelectric material of this invention is markedly advantageous over the conventional $PbTiO_3$ type piezoelectric material in plarization property.

Figure 2:
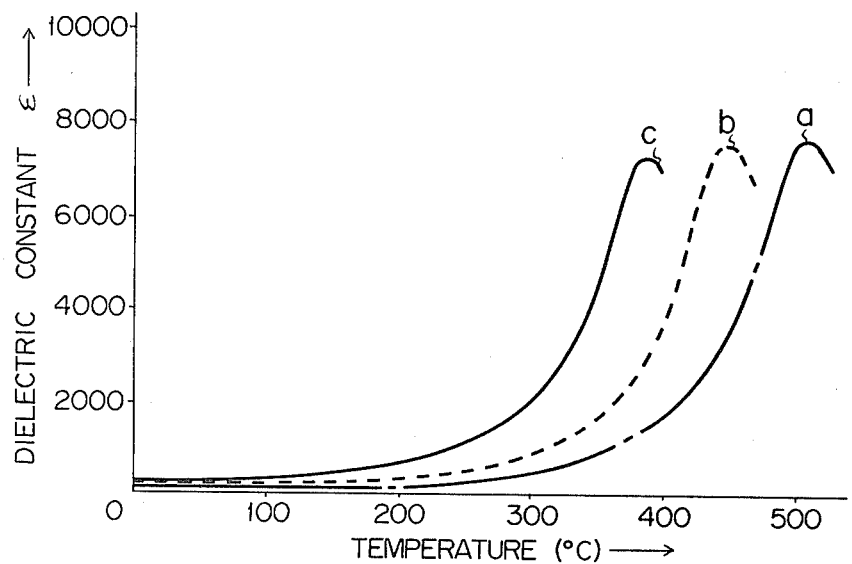
FIG. 2 is a graph showing the relationship between the temperature and the dielectric constant for piezoelectric materials according to this invention and a conventional piezoelectric material.

FIG. 2 shows the relationship between the dielectric constant and the temperature obtained from measurements applied to the materials of Examples 10, 13 and Control 6. Curves (a), (b), (c) shown in FIG. 2 represent Examples 10, 13 and Control 6, respectively. It is clearly seen that the piezoelectric material of this invention has a Curie point high enough to permit a stable use thereof at temperatures higher than 300° C.

Figure 3:
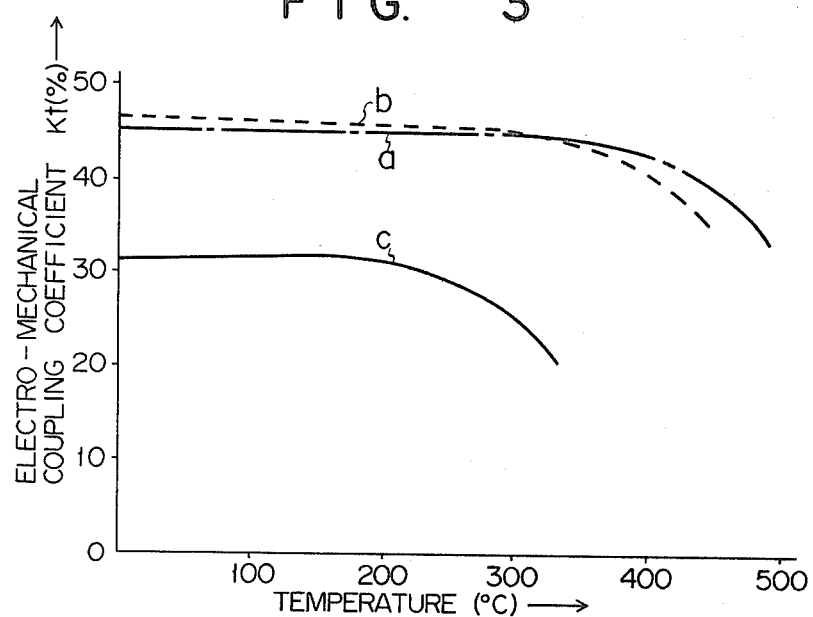
FIG. 3 is a graph showing the relationship between the temperature and the electro-mechanical coupling coefficient for the samples of the piezoelectric materials shown in FIG. 2.

FIG. 3 shows the relationship between the temperature and the electro-mechanical coupling coefficient Kt for the material of Examples 10, 13 and Control 6 as in FIG. 2. Curves (a), (b), (c) shown in FIG. 3 represent Examples 10, 13 and Control 6, respectively. It is clearly seen that the piezoelectric material of this invention, having a high Curie point, exhibits a substantially constant value of Kt over such a wide temperature range as between the room temperature and about 400° C. Further, FIGS. 2 and 3 collectively indicate that the piezoelectric material of this invention can be used at the highest temperature in this field.

Figure 4:
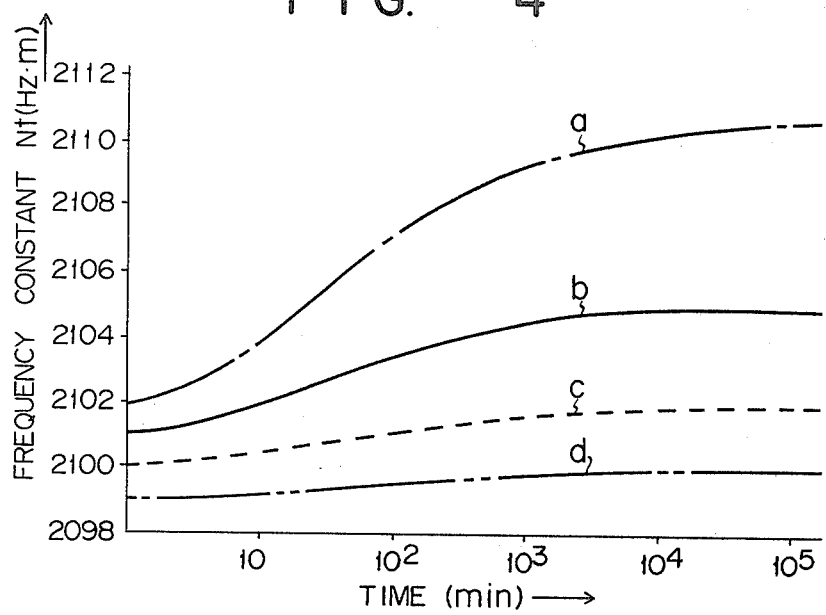
FIG. 4 shows changes with time in frequency constant of piezoelectric materials according to this invention.

FIG. 4 shows the change with time in frequency constant Nt(Hz·m) for each of the ceramic filters made of the materials of Examples 21, 46, 42 and 47 shown in Table 1. Curves (a), (b), (c) and (d) shown in FIG. 4 represent Examples 21, 46, 42 and 47, respectively. It is important to note that these Examples are substantially the same in composition except that an additive of MnO and/or NiO is contained in Examples 46, 42 and 47. FIG. 4 shows that Examples 46, 42 and 47 are superior in time variability to Example 21 (Curve "a") which does not contain the particular additive. In other words, FIG. 4 substantiates that the additive used in this invention is very effective for improving the time variability of the piezoelectric material.

Further, the ceramic filters mentioned above were subjected to tests for measuring the temperature characteristic and time variability of the resonance frequency, obtaining the results as shown in Table 2.

Table 2

|  | Example 21 | Example 46 | Example 42 | Example 47 |
|---|---|---|---|---|
| Temperature coefficient of resonance frequency (−40 to 80° C.) p.p.m./°C. | 77 | 30 | 25 | 21 |
| Change with time in resonance frequency (in one year) percent | 0.24 | 0.12 | 0.10 | 0.09 |

Table 2 shows that the addition of MnO and/or NiO enables the piezoelectric material of this invention to exhibit further improved temperature characteristic and time variability. Incidentally, similar experiments were conducted by using ceramic filters made of the materials of Examples 43 and 48 each containing $Fe_2O_3$ as the additive, with the result that $Fe_2O_3$ was found to be substantially equivalent to MnO in the effects produced.

FIG. 5, shows the relationship between the mechanical quality factor Qm and the amount of NiO+MnO for the materials of Examples 49 to 57 shown in Table 1. Points (a) to (i) plotted in FIG. 5 represent Examples 49 to 57, respectively. It is important to note that these Examples are substantially the same in composition except that each of Examples 50 to 57 contains both NiO and MnO, the amount of NiO being equal to that of MnO. It is clearly seen that the piezoelectric material of this invention containing the particular additive exhibits a very large value of Qm, compared with Example 49 (point "a") which does not contain the additive. As seen from FIG. 5, the value of Qm is increased to exceed, for example, 2,000 in some cases by the use of the particular additive.

As described in detail, the piezoelectric material of this invention has a high Curie point and, thus, can be used stably at temperatures higher than 300° C. Further, the invented piezoelectric material is suitable for use in such a high frequency region as more than several MHz and is prominently advantageous over the conventional $PbTiO_3$ type piezoelectric material in polarizing property. Still further, the piezoelectric material of this invention exhibits excellent temperature characteristic and time variability. Naturally, the piezoelectric material of this invention can be used as the material of various transducing elements, with quite satisfactory effects.

The piezoelectric material of the present invention exhibiting such excellent properties as mentioned above can be used extensively as exemplified in the following:

(1) Determination of vibration, acceleration and pressure applied to high temperature objects approaching 500° C. or other objects subjected to sharply changing temperature and also determination of presssure prevailing in the interior of such high temperature objects.

(2) Application of ultrasonic waves to high temperature objects

The piezoelectric material of this invention can be used as a source of ultrasonic waves in working high temperature objects using ultrasonic waves or as an element for examining said objects using ultrasonic waves.

(3) Generation of strong ultrasonic waves

When subjected to vigorous vibrations, ordinary piezoelectric materials fail to be useful due to high heat build-up. However, those of the invention withstand application at a temperature exceeding 300° C., offering great advantage in generating strong ultrasonic waves by heavy vibrations.

(4) Application in high frequency regions

Conventional piezoelectric materials have the drawback that they have a large dielectric constant e.g., 1000, and are unadapted for use in high frequency regions. Generally, impedance Z is expressed by an equation $$Z = d(2\pi f \cdot \epsilon \cdot S)$$

(where d represents the thickness of a sample, S its cross sectional area, f the frequency used and $\epsilon$ a dielectric constant). Therefore, d should be reduced in inverse proportion to f, so that the impedance may be eventually indicated as $Z \propto 1(f^2 \cdot \epsilon \cdot S)$. If f increases, Z will sharply fall because $f^2$ is a large factor. Though the matching of Z requires S or $\epsilon$ to be reduced, it is more advantageous to decrease $\epsilon$, because S is subject to certain limitation from the standpoint of working. The piezoelectric materials of this invention have a dielectric constant $\epsilon$ of about 200, that is, as low as 1/5 to 1/10 of that of the prior art product. Accordingly, in the case where the prior art piezoelectric materials are available up to the frequency of 10 mHz those of this invention permit application at a frequency as 50 mHz.

(5) Preparation of probes for linear scan type ultrasonic diagnosis apparatus

It was customary in the past to use PZT type piezoelectric materials for forming sonic transducing elements used in probes of ultrasonic diagnosis apparatus. It should be noted in this connection that such a probe tends to be required to generate higher and higher frequency waves, rendering it necessary to provide a thin plate of piezoelectric member sized as large as, for example, 50 to 100 mm length and 15 to 20 mm width. However, the conventional piezoelectric material mentioned above fails to meet this requirement. In contrast, the piezoelectric material of this invention is excellent in sintering property and mechanical strength, rendering it possible to produce without difficulty a large thin plate having a thickness of, for example, 200μ. It follows that the piezoelectric material of this invention is suitable for forming a probe generating a high frequency wave and having a high sensitivity.

As described above in detail, it will be understood that the piezoelectric materials of this invention can be used in the applications which have been impossible with those of the prior art. A problem is caused when a high frequency filter or resonator changes frequency with time and temperature. Since, however, the present product varies minimally in frequency characteristics, it has several practical applications.

What we claim is:

1. A piezoelectric oxide material, having a general formula:

$$(1-x)PbTiO_3 - xPb(Co_{\frac{1}{2}}W_{\frac{1}{2}})O_3$$

where, "x" ranges between 0.01 and 0.10, and 0.5 to 20 atomic % of Pb is replaced by at least one element selected from the group consisting of Ba, Sr and Ca.

2. The material according to claim 1, wherein said "x" ranges between 0.01 and 0.05 and Pb is replaced in an amount of 0.5 to 10 atomic %.

3. The material according to claims 1 or 2, which further comprises 0.05 to 2.0% by weight of at least one additive selected from the group consisting of MnO, NiO and $Fe_2O_3$.

4. The material according to claims 1 or 2, which further comprises 0.05 to 1.0% by weight of at least one additive selected from the group consisting of MnO, NiO and $Fe_2O_3$.

* * * * *